(12) United States Patent
Chang

(10) Patent No.: US 12,356,562 B2
(45) Date of Patent: Jul. 8, 2025

(54) PORTABLE CONTROLLER WITH REPLACEABLE MODULE

(71) Applicant: Hung-Yi Chang, Kaohsiung (TW)

(72) Inventor: Hung-Yi Chang, Kaohsiung (TW)

( * ) Notice: Subject to any disclaimer, the term of this patent is extended or adjusted under 35 U.S.C. 154(b) by 284 days.

(21) Appl. No.: 18/058,880

(22) Filed: Nov. 28, 2022

(65) Prior Publication Data

US 2024/0179855 A1 May 30, 2024

(51) Int. Cl.
*H05K 5/00* (2025.01)
*G06F 1/16* (2006.01)

(52) U.S. Cl.
CPC ......... *H05K 5/0086* (2013.01); *H05K 5/0018* (2022.08); *G06F 1/1632* (2013.01)

(58) Field of Classification Search
CPC ... G06F 1/1632; H05K 5/0018; H05K 5/0086
See application file for complete search history.

(56) References Cited

U.S. PATENT DOCUMENTS

| | | | |
|---|---|---|---|
| 7,000,124 B2 * | 2/2006 | Chen | G06F 1/266 713/300 |
| 2006/0047983 A1 * | 3/2006 | Aleyraz | G06F 1/3215 713/300 |
| 2020/0326955 A1 * | 10/2020 | Adiletta | G06F 1/1684 |

* cited by examiner

*Primary Examiner* — Terrell S Johnson

(57) ABSTRACT

A portable controller with replaceable module includes: a main body having a touchable display screen; a control system installed in the main body; a power supply system installed in the main body and connected to the control system to detect and adjust the power supply; a functional module, detachably connected to the main body to provide data, wherein, the control system is used to display data on the touchable display screen relative to the function module and to control the function module through the touchable display screen. Therefore, the portable controller with replaceable module could be applied to different functional modules to achieve wide area use purpose.

6 Claims, 2 Drawing Sheets

PORTABLE CONTROLLER WITH REPLACEABLE MODULE

FIELD OF THE INVENTION

The present invention relates to a portable controller, and in particular to a portable controller with a replaceable module.

BACKGROUND OF THE INVENTION

The prior art portable devices could be broadly classified into devices for wide area use purpose and devices for specific use purpose. The former, for example, is a notebook computer, and the latter, for example, is a miniature gas detection and purification device which is portable for monitoring air quality and purifying the air surrounding the user.

Generally, devices for wide area use purpose such as notebook computers have larger volumes than the devices for specific use purpose. In general use, maybe users can endure such defects, while in special conditions, such as transmission towers, small submerged diving chambers, computer rooms with densely arranged wires, due to the limitation of space or weight, the user cannot use devices for wide area; use purpose, such as notebook computers.

Although portable devices for specific use purpose have lighter weight and smaller volume than currently used notebook computers, the uses of these devices are confined. This defect will cause that the users cannot work conveniently, or the user must further carry other portable devices of different functions. As a result, the overall space and weight needed are increased.

Therefore, it is known that the currently used portable devices are not suitable for the wide area use purpose due to the limitation of space and weight. As a result, there is an eager demand for a novel portable controller with a replaceable module, which could improve the defects in the prior art, while provides convenience to users.

SUMMARY OF THE INVENTION

Accordingly, the object of the present invention is to provide a portable controller with a replaceable module, which can achieve the object of wide area use purpose with the limitation of finite space and weight.

Another object of the present invention is to provide a portable controller with a replaceable module, wherein the functional module is replaceable so as to achieve the object of wide area use purpose.

A further object of the present invention is to provide a portable controller with a replaceable module, which provides a power arrangement fitted to the functional module so as to be used for different functional modules, as a result, the present invention can be used in wide area use purpose.

A yet object of the present invention is to provide a portable controller with a replaceable module, which can reversely control the power source.

To achieve above object, the present invention provides a portable controller with a replaceable module comprising: a main body (10) having a touchable display screen (11); a control system (20) installed within the main body (10); a power supply system (30) installed within the main body (10) and connected to the control system (20) for detecting and adjusting the power supply; and a functional module (40) detachably connected to the main body (10) for providing data; wherein the control system (20) serving for displaying data related to the functional module (40) on the touchable display screen (11); and the functional module (40) is controllable through the touchable display screen (11).

The power supply system (30) includes a power arrangement detection module (31) and a voltage adjustment module (32); the power arrangement detection module (31) is used to detect the power arrangement of the functional module (40); and the voltage adjustment module (32) is used to the adjust voltage to be matched to the power arrangement of the functional module (40).

The power arrangement detection module (31) includes a reverse power controller (311) for reversely controlling a power source POW.

The main body (10) further includes two power outputs P1 and P2; one power output P1 serving for providing bypass mode power output, and another power output P2 serving for providing power output after adjustment;

The functional module (40) is selected from an environmental sensor, an audio device, a video device, a wireless communication device, a positioning device (or tracker), a programmable memory, a battery charger/discharger, and a thermoelectric converter.

The main body (10) further includes an analog input/output interface or a digital input/output interface.

The main body (10) further includes a communication interface CIO.

The communication interface CIO is selected from an Inter-Integrated Circuit Bus (I²C Bus) interface, a universal asynchronous receiving and transmitting interface, a serial peripheral interface (SPI), a secure digital input/output interface (SDIO), a recommended standard interface, a controller area network bus (CAN bus) interface and a universal serial bus (USB) interface.

The main body (10) further includes a single power output, which serves for providing bypass mode power output or power output after adjustment.

DETAILED DESCRIPTION OF THE INVENTION

In order that those skilled in the art can further understand the present invention, a description will be provided in the following in details. However, these descriptions and the appended drawings are only used to cause those skilled in the art to understand the objects, features, and characteristics of the present invention, but not to be used to confine the scope and spirit of the present invention defined in the appended claims.

Figure 1:
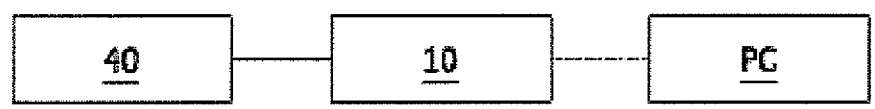
FIG. 1 is a system block diagram showing the structure of the portable controller with a replaceable module of the present invention.

Referring to FIG. 1, the system block diagram of the present invention is illustrated.

The structure of the present invention includes a main body 10 and a functional module 40 which is detachably connected with the main body 10 for providing data. The main body 10 serves to display data from the functional module 40 and control the functional module 40.

The functional module 40 may be an environmental sensor, an audio device, a video device, a wireless communication device, a positioning device (or tracker), a programmable memory, a battery charger/discharger, or a thermoelectric converter. The environmental sensor, for instance, is a sensor for temperature, humidity, atmosphere pressure, carbon dioxide, volatile organic compounds, particulate matters (PM 2. 5), etc. The wireless communication device, for example, is a communication device of Bluetooth, Wi-Fi, 4G, 5G, etc. The positioning device, for instance, is a device for positioning of GPS, Wi-Fi, mobile network, etc. The programmable memory is, for instance, is an electrically erasable programmable read-only memory (EEPROM), flash memory, etc. Thereby, by replacing different functional module, a portable controller with replaceable modules of the present invention is achieved with wide area use purpose.

The main body 10 may be connected to a personal computer or an adapter so as to be used more widely. When the main body 10 is connected to a personal computer or a notebook computer, the main body 10 could be connected with the functional module 40 which can be connected with, read data from, or bidirectionally control a portable controller with replaceable module by using programming languages, such as Python, Java, etc. By replacing a functional module of different functions, the personal computer or notebook computer could have the function provided by the functional module 40.

Figure 2:
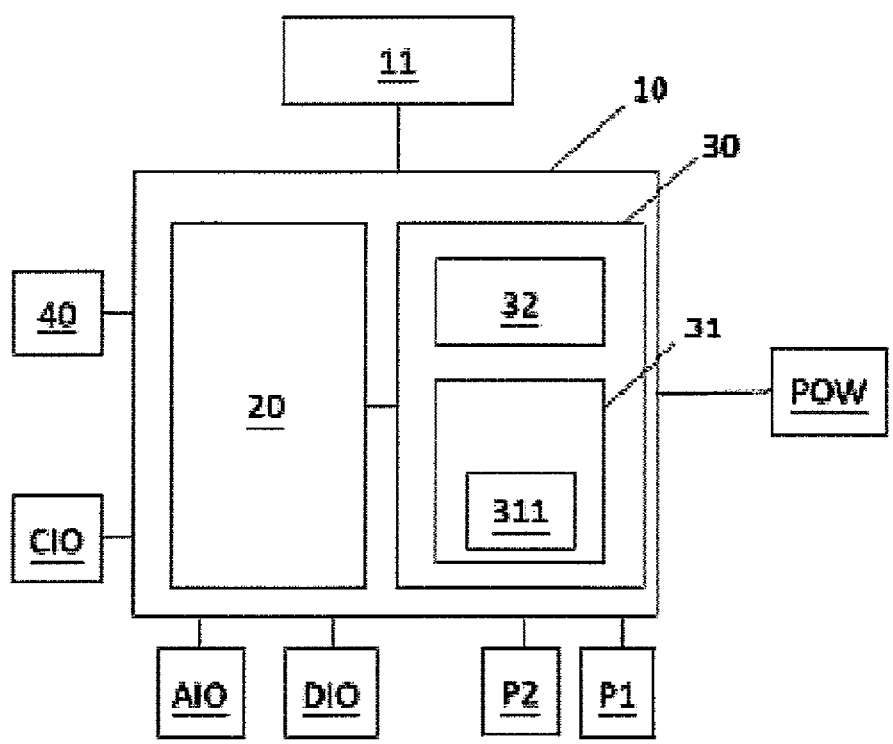
FIG. 2 is a system block diagram showing the details of the device illustrated in FIG. 1 according to the present invention.

FIG. 2 is a block diagram with the detail of the present invention. The embodiment illustrated in FIG. 2 shows the details of the present invention. The structure of the present invention includes the following elements. A main body 10 has a control system 20 and a power supply system 30 connected to the control system 20 for detecting and adjusting power supply. The control system 20 serves to display data on the touchable display 11, where supply of data depends on the functional module 40. By using the touchable display 11, the control system 20 could control the functional module 40. The touchable display 11 is extended from the main body 10. A functional module 40 is detachably connected to the main body 10 for providing data to the main body 10.

Referring to FIG. 2, to adapt the different functional modules, in the embodiment of the present invention, the power supply system 30 includes a power arrangement detection module 31 and a voltage adjustment module 32. The power arrangement detection module 31 serves to detect the power arrangement of the functional module 40. The voltage adjustment module 32 serves to adjust voltage for adapting the power arrangement of the functional module 40. The power arrangement, for example, is USB-PD (USB Power Delivery) or Quick Charge (QC).

Referring to FIG. 2, especially, in the embodiment of the present invention, the power arrangement detection module 31 includes a reverse power controller 311 for reversely controlling a power source (POW). For instance, in USB-PD, the reverse power controller 311 could be controlled through CC pins, or in Quick charge, the reverse power controller 311 could be controlled through D+ or D− port.

With reference to FIG. 2, in the embodiment of the present invention, the main body 10 has a plurality of power outputs for providing various power modules to be selected. In this embodiment, there are two power outputs P1 and P2, one for providing bypass mode power output, and another for providing power output after adjustment. For example, in USB-PD, the power output P1 outputs directly power of 20V/3A, while the power output P2 outputs power of 0.2V/1A which is adjusted by the voltage adjustment module 32. Besides, a four power output mode is satisfied in the present invention, however, this will not be described herein.

In the embodiment of the present invention, the main body 10 may further include an analog input/output interface (AIO) or a digital input/output interface (DIO), or in the embodiment of the present invention, the main body 10 may further include a communication interface CIO. The communication interface CIO may be an Inter-Integrated Circuit Bus ($I^2C$ Bus) interface, a universal asynchronous receiving and transmitting interface, a recommended standard interface (such as RS-232`RS-485, etc.), a serial peripheral interface (SPI), a secure digital input/output interface (SDIO), a controller area network bus (CAN bus) interface or a universal serial bus (USB) interface. For example, an Inter-Integrated Circuit Bus ($I^2C$ Bus) interface serves to connect a low speed peripheral device of simple structure, and less connection pins, and a controller area network bus (CAN bus) interface serves to be connected to a vehicle bus, etc.

Referring to FIG. 2, in the embodiment of the present invention, the main body 10 further includes a single power output (P1) or (P2) for providing a bypass mode power output or providing power output after adjustment. For instance, in USB-PD, the power output P1 may be singly used in output power of 20V/3A, or the power output P2 may be singly used to output power of 0.2V/1A which is adjusted by the voltage adjustment module 32.

In summary, in the portable controller with replacement module, by the power supply system 30 to detect and adjust power supply, the control system 20 could match with different functional module 40 and could display data of and control various functional modules 40. Therefore, it can achieve the object of wide area use purpose by replacement of the functional module 40 with the limitation of finite space and weight.

The present invention is thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A portable controller with a replaceable functional device comprising:
   a main body (10) having a touchable display screen (11), the main body (10) including a plurality of power outputs and a communication interface (CIO); the power outputs having various power modes;
   a control system (20) installed within the main body (10);
   a power supply system (30) installed within the main body (10) and connected to the control system (20) for detecting and adjusting power supply; and
   the replaceable functional device (40) detachably connected to the main body (10) for providing data;
   wherein the plurality of power outputs includes two power outputs P1 and P2; one power output P1 serving for providing bypass mode power output, and another power output P2 serving for providing power output after adjustment;
   wherein the control system (20) serving for displaying data related to the replaceable functional device (40) on the touchable display screen (11); and the replaceable functional device (40) is controllable through the touchable display screen (11); and
   wherein the main body (10) is connected to a personal computer or a notebook computer; the personal computer or the notebook computer being able to be connected to, read data from and bidirectionally control the replaceable functional device (40).

2. The portable controller with the replaceable functional device as claimed in claim 1, wherein the power supply system (30) includes a power arrangement detection module (31) and a voltage adjustment module (32); the power arrangement detection module (31) is used to detect the power arrangement of the replaceable functional device (40); and the voltage adjustment module (32) is used to adjust voltage to be matched to the power arrangement of the replaceable functional device (40).

3. The portable controller with the replaceable functional device as claimed in claim 2, wherein the power arrangement detection module (31) includes a reverse power controller (311) for reversely controlling a power source (POW).

4. The portable controller with the replaceable functional device as claimed in claim 1, wherein the replaceable functional device (40) is selected from an environmental sensor, an audio device, a video device, a wireless communication device, a positioning device (or tracker), a programmable memory, a battery charger/discharger, and a thermoelectric converter.

5. The portable controller with the replaceable functional device as claimed in claim 1, wherein the main body (10) further includes an analog input/output (AIO) interface or a digital input/output (DIO) interface.

6. The portable controller with the replaceable functional device as claimed in claim 1, wherein the communication interface CIO is selected from an Inter-Integrated Circuit Bus (I$^2$C Bus) interface, a universal asynchronous receiving and transmitting interface, a serial peripheral interface (SPI), a secure digital input/output interface (SDIO), a recommended standard interfacea, a controller area network bus (CAN bus) and a universal serial bus (USB) interface.

* * * * *